May 30, 1967 T. BRENIG 3,322,981
CRYSTAL TEMPERATURE COMPENSATION
Filed April 29, 1964 2 Sheets-Sheet 1

INVENTOR:
THEODORE BRENIG,
BY [signature]
HIS ATTORNEY.

CRYSTAL TEMPERATURE COMPENSATION

Filed April 29, 1964 2 Sheets-Sheet 2

INVENTOR:
THEODORE BRENIG,
BY I. David Blumenfeld
HIS ATTORNEY.

United States Patent Office 3,322,981
Patented May 30, 1967

3,322,981
CRYSTAL TEMPERATURE COMPENSATION
Theodore Brenig, Lynchburg, Va., assignor to General Electric Company, a corporation of New York
Filed Apr. 29, 1964, Ser. No. 363,550
10 Claims. (Cl. 310—8.9)

This invention relates to a temperature compensating arrangement. More particularly, it relates to an electrical compensating network for a temperature sensitive electromechanical resonator such as a piezoelectric crystal.

Piezoelectric devices have been widely used for precise frequency control in a great variety of electronic equipments. While this invention is not limited thereto, it is particularly applicable to and will be described in connection with the temperature compensation of a piezoelectric crystal utilized in an oscillator circuit. It will be understood, however, that the invention is equally useful in any circuit or equipment wherein a piezoelectric crystal is utilized as a frequency controlling elements, as for example, in a filter or the like.

Piezoelectric crystal devices are temperature sensitive, and the series or parallel resonance frequency of the crystal, for a given size and angle of cut, depends on the ambient temperature. For many applications, this is of no consequence since the required degree of frequency stability is less than any variations produced by temperature changes which may be on the order of twenty to thirty parts per million or more. However, where a high degree of frequency stability is required and where the equipment is to be utilized in an environment which is subject to wide temperature variations, the changes in the crystal resonance frequency with temperature may affect the frequency stability sufficiently so that efforts must be made to counteract these temperature effects.

Hitherto, attempts have been made to minimize or eliminate the effects of temperature on the resonance frequency of a piezoelectric crystal either by controlling the temperature sensitivity of the piezoelectric crystal and its associated circuitry, controlling the environmental temperature, or by compensating for the frequency variations due to temperature. The first approach, that of minimizing the sensitivity of the crystal and its associated circuitry to temperature variations, often takes the form of controlling the angle at which the crystal is cut with respect to the crysallographic axes of the raw crystal. The temperature coefficient of the piezoelectric crystal may, in this manner, be reduced since it is known that the temperature coefficient of the device is dependent on the angle of cut. While this approach is useful in many instances, it also has many shortcomings which make it impractical for many applications, particularly, since the degree to which the temperature coefficient is reduced in this manner is very limited. Also, the range of temperatures over which this approach is effective is usually quite small. Therefore, it has relatively little utility in electronic equipments which must operate in environments where the variation in ambient temperature is large. Furthermore, the complexity of the fabricating process necessary to produce the crystals to the desired accuracy is substantial as is the additional cost of fabricating crystals of this type.

Another prior art technique is based on the straightforward concept of maintaining the frequency constant by maintaining the ambient temperature to which the crystal is exposed constant. This is achieved by placing the crystal in an oven and controlling the temperature within the oven. While this is highly effective in maintaining the piezoelectric crystal frequency constant, it has many drawbacks particularly in terms of today's electronic design principles. One of these drawbacks is the bulk and size which is added to the electronic circuit since such crystal ovens are relatively large compared to today's miniature and microminiature circuit components. Hence, the use of ovens to stabilize the ambient temperature for the crystal is of no utility in those environments where small size and volume is at a premium.

In addition, ovens, which are electrically heated and controlled, introduce a time delay into the operation of the circuit. When the equipment, including the crystal and crystal oven, is first energized, it takes a finite period of time for the oven to reach the proper temperature and for the crystal to reach the proper operating frequency. For example, where a crystal and crystal oven are used in a radio transmitter, a finite and usually rather lengthy period of time is needed before the transmitter can be placed on the air.

Crystal ovens are, of course, also energy consuming devices which require power for their heaters to maintain the temperature within the ovens at the desired level. Under many circumstances, this presents no great difficulty since adequate energy sources or power supplies are available for the equipment incorporating the crystal oven. However, in many situations, such as mobile communication equipment for example, the equipment incorporating the crystal and the crystal oven must operate from a limited supply source such as the vehicle battery. In situations such as this, the battery current drain, due to the crystal oven, may be many orders of magnitude larger than the current drain for the entire remaining portion of the radio equipment. In fact, the amount of current drain produced by the crystal oven may well be sufficiently large to make its usage prohibitive. Thus, while the crystal oven will maintain the crystal frequency constant, its usage presents such severe and difficult additional problems that other schemes for minimizing the frequency deviation due to temperature must be found.

Temperature compensation schemes are such a mechanism. Characteristically, temperature compensation arrangements are based on the principle that some temperature responsive arrangement is provided which changes the crystal frequency in an equal and opposite sense to the frequency change produced by the variations in ambient temperature. One of these arrangements is based on the known physical fact that the resonant frequency of a crystal may be varied by varying the magnitude of the external reactance, and preferably the external capacitance reactance, connected in circuit with the crystal. Such prior art compensating arrangements were essentially circuits in which thermally responsive mechanical switching means, such as bimetallic switch elements, were used to connect reactive components, such as capacitors, in circuit with the crystal selectively as a function of temperature.

Typically, the bimetallic switches were actuated as the ambient temperature reached discrete temperatures thereby selectively connecting or disconnecting capacitors in circuit with the crystal. In this manner, the frequency excursion of the crystal with temperature was limited within predetermined limits as established by the discrete operating temperatures of the bimetallic switches. This system, while effective for some purposes, also had its limitations. First, the use of bimetallic switches themselves was undesirable from the standpoint of size and bulk. Furthermore, the compensating effect was relatively limited since it was only possible to limit the frequency excursion between fixed limits, and there was no continuous, complete compensation over an entire temperature range since such switches are, of course, discrete "on-off" type of devices.

Furthermore, it was impossible to compensate any but the most simple crystal temperature-frequency characteristics. The temperature-frequency characteristics of crystals are not necessarily linear, nor is the slope or the sign of the slope (the direction of the frequency change with temperature) the same over the entire temperature range. Many crystal temperature-frequency characteristics are, in fact, complex curves.

Temperature variations alter the frequency of mechanical resonance of the crystal through their effect on the density, linear dimensions, and the moduli of elasticity of the crystal. Inasmuch as some of the elastic constants of a crystal are positive, while others are negative, the temperature, coefficient of frequency may be either positive or negative or zero over various temperature ranges according to the mode of operation, the orientation of the crystal plate, and the shape of the plate. For example, the very commonly used "AT" cut crystal has an "S" shaped temperature-frequency characteristic. Over one range of frequency, the change in frequency increases with temperature, i.e., the temperature-frequency curve has a positive slope. As the temperature increases beyond the first range, the frequency begins to decrease with increasing temperature (i.e., a negative slope to the frequency-temperature curve) and at yet higher temperatures, the frequency again increases with increases in temperature (i.e., a positive slope to the frequency-temperature characteristics). It is virtually impossible to compensate frequency-temperature characteristics of such a complex nature by means of thermal switch arrangements. A need, therefore, exists for an accurate, flexible, compensating arrangement in which complex crystal temperature-frequency characteristics may be compensated and in which the compensation is effected in a continuous manner over a given temperature range rather than in a discrete or stepwise fashion.

It is, therefore, a primary object of this invention to provide a compensating arrangement for a temperature-sensitive piezoelectric device in which the compensating effects are continuous over the entire desired temperature range.

Another object of this invention is to provide a compensation arrangement for a temperature-sensitive piezoelectric device which is capable of compensating piezoelectric devices having complex frequency-temperature characteristics.

Still another object of this invention is to provide a compensating arrangement for a temperature-sensitive piezoelectric device which is capable of compensating temperature-frequency characteristics having different slopes over different portions of the operating temperature range.

It is also desirable in providing compensating arrangements for a temperature-sensitive piezoelectric device to provide a plurality of compensating circuits, each of which is effective over one portion of the temperature range so that each circuit is independent of the action of the remaining circuits. In this manner, each of the circuits may be individually designed to form a complete network covering the entire desired temperature range without producing complex and difficult to analyze interactions between these circuits. The advantage of an arrangement of this type is that each of the circuits may be individually designed in an analytical and accurate manner rather than proceeding on a cut-and-try basis. This is particularly significant where the circuit must have compensating effects which have slopes of different signs in those portions of the temperature range where the slope of the crystal temperature-frequency characteristics changes sign.

It is, therefore, still another object of this invention to provide a compensating arrangement for a temperature-sensitive piezoelectric device which includes a plurality of compensating circuits, each active over a different portion temperature range without any interaction among the circuits.

Yet another object of this invention is to provide a temperature compensating network for a piezoelectric device in which individual compensating circuit components forming the network are operative over selective temperature ranges only without affecting the remaining circuits and may have compensating characteristics of differing slopes and of different signs.

Other objects and advantages of the instant invention will become apparent as the description thereof proceeds.

These various objects and advantages are achieved in one form of the invention by providing a compensating network which includes a plurality of electrical circuits or brances, each of which is effective over a different portion of the operating temperature range, connected in circuit with one or more capacitors. Each of the circuits includes a temperature-sensitive resistive device (such as a thermistor) which is effective over the desired portion of temperature range. The temperature coefficients of the individual thermistors may be either positive or negative with the sign of the temperature coefficient depending on the slope of the temperature-frequency characteristic of the piezoelectric device in that particular temperature range. Thus, each of these circuits produces a resistance variation as a function of the temperature which, in turn, affects the magnitude of the capacitive reactance seen by the piezoelectric device. This variation in the capacity seen by the crystal is such as to produce a frequency change which is opposite and equal to frequency variations of the crystal due to temperature changes.

The novel features, which are believed to be characteristics of this invention, are set forth, with particularity, in the appended claims. The invention itself, however, both to its organization and method of operation, together with further objects and advantages thereof, may best be understood by reference to the following description taken in connection with the accompanying drawings in which:

Figure 1:
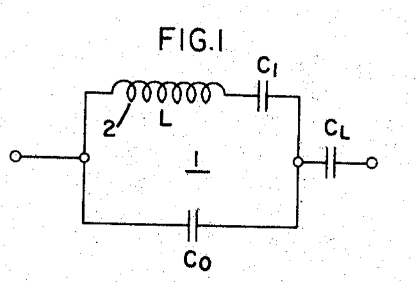
FIG. 1 is a schematic diagram of the equivalent electrical circuit of a piezoelectric device and its load capacity and is useful in understanding the basic principles of the invention.

FIG. 1 is a schematic diagram of the equivalent circuit of a piezoelectric crystal, its electrodes, and the external load capacitance seen by the crystal and will be useful in understanding the basic underlying physical principles upon which the temperature-compensating network of the instant invention is based. Thus, FIG. 1 shows a first shunt circuit 1 representing the crystal and its electrodes connected in series with a load capacitance $C_L$. The shunt circuit 1 consists of a branch 2, including an inductance L and capacitance $C_1$, connected in shunt with a capacitor $C_0$. Inductance L, in branch 2, represents the equivalent mass of the piezoelectric crystal, capacitor $C_1$ represents the equivalent compliance of the vibrating crystal, and $C_0$ represents the electrostatic capacitance of the crystal electrodes with the crystal in position and not vibrating. The equivalent circuit shown in FIG. 1 is, to a certain extent, an idealized version in that it assumes a crystal with an infinite Q, i.e., no resistance due to frictional losses within the crystal. However, since crystals, having Q's on the order of twenty thousand or more, are available and physically realizable, the elimination of resistance or damping in the crystal makes substantially no difference in the analysis which follows.

The series resonance frequency $f_s$ of the crystal itself (i.e., of L and $C_1$ without electrode capacitance $C_0$ and without the external capacitance $C_L$), is defined by the well-known equation for the series of resonance of an L–C circuit.

$$fs=\frac{1}{2\pi\sqrt{LC_1}} \qquad (1)$$

The series resonance frequency of the entire circuit, including the electrode capacitance $C_0$ and the load capacitance $C_L$, may be derived in the following manner by initially determining the impedance Z of the entire circuit. The impedance Z for the entire circuit may be defined as follows:

$$Z=X_{CL+}+X_{Network\,1}=X_{CL}+\frac{X_{CO}(X_{Branch\,2})}{X_{CO}+X_{Branch\,2}} \qquad (2)$$

$$=\frac{1}{jwC_L}+\frac{\frac{1}{jwC_0}\left(\frac{1}{jwC_1}+jwL\right)}{\frac{1}{jwC_0}+\frac{1}{jwC_1}+jwL} \qquad (3)$$

$$=\frac{1}{jwC_L}+\frac{\frac{1}{jwC_1}+jwL}{\frac{jwC_0}{jwC_0}+\frac{jwC_0}{jwC_1}+j^2w^2LC_0} \qquad (4)$$

$$=\frac{1}{jwC_L}+\frac{\frac{1}{jwC_1}+jwL}{1+\frac{C_0}{C_1}-w^2LC_0} \qquad (5)$$

At series resonance, the impedance Z of the circuit is, by definition, equal to zero. Therefore, setting Equation 5 to equal zero, the frequency $f_s'$ may be derived in the following manner:

$$\frac{1}{-jw'C_L}=\frac{\frac{1}{jw'C_1}+jw'L}{1+\frac{C_0}{C_1}-w'^2LC_0} \qquad (6)$$

$$\frac{-\left(1+\frac{C_0}{C_1}-w'^2LC_0\right)}{jw'C_L}=\frac{1}{jw'C_1}+jw'L \qquad (7)$$

$$-1-\frac{C_0}{C_1}+w'^2LC_0=\frac{C_L}{C_1}-w'^2LC_L$$

$$w'^2(LC_0+LC_L)=\frac{C_L}{C_1}+\frac{C_0}{C_1}+\frac{C_1}{C_1} \qquad (8)$$

$$w'^2=\frac{C_L+C_0+C_1}{C_1}\cdot\frac{1}{L(C_0+C_L)} \qquad (9)$$

$$w'_s=\sqrt{\frac{C_L+C_0+C_1}{LC_1(C_0+C_L)}}$$

$$2\pi f'_s=\frac{1}{\sqrt{LC_1}}-\sqrt{\frac{C_L+C_0+C_1}{(C_0+C_L)}}$$

$$f_s'=\frac{1}{2\pi\sqrt{LC_1}}\sqrt{\frac{C_L+C_0+C_1}{C_0+C_L}} \qquad (10)$$

However, the term $$\frac{1}{2\pi\sqrt{LC_1}}$$

in Equation 10 is, according to Equation 1, equal to $f_s$, the series resonance frequency of the crystal itself. Thus, the series resonance frequency $f_s'$ of the entire circuit is defined by the following equation:

$$f'_s=fs\sqrt{\frac{C_L+C_0+C_1}{C_0+C_L}} \qquad (11)$$

Rearranging Equation 11 in the form of the ratio of the series resonant frequency of the circuit $f_s'$ to the series resonant frequency of the crystal $f_s$, the following relationship is obtained:

$$\left(\frac{fs'}{fs}\right)^2=\frac{C_L+C_0+C_1}{C_0+C_L}=\frac{C_L+C_0}{C_0+C_L}+\frac{C_1}{C_0+C_L} \qquad (12)$$

$$\left(\frac{fs'}{fs}\right)^2=1+\frac{C_1}{C_0+C_L} \qquad (13)$$

However, by definition, the series resonance frequency of the circuit, as shown, is equal to the series resonance frequency $f_s$ of the crystal itself plus the incremental change $\Delta f_s$ due to the electrode capacitance $C_0$ and the load capacitance $C_L$, i.e., the series resonance frequency of the circuit $f_s'$ differs from the series resonance frequency of the crystal itself, $f_s$ by an incremental amount $\Delta f_s$ as shown:

$$f_s'=f_s+\Delta f_s \qquad (14)$$

Substituting Equation 14 in Equation 13 and expanding shows the following relationship between the incremental change of the series resonance frequency and the resonant frequency.

$$\left(\frac{f_s+\Delta f_s}{fs}\right)^2=1+\frac{C_1}{C_L+C_0} \qquad (15)$$

$$\left(\frac{f_s}{f_s}+\frac{\Delta f_s}{f_s}\right)^2=1+\frac{C_1}{C_L+C_0} \qquad (16)$$

$$\left(1+\frac{\Delta f_s}{f_s}\right)^2=1+\frac{C_1}{C_L+C_0} \qquad (17)$$

$$1+\frac{2\Delta f_s}{f_s}+\left(\frac{\Delta f_s}{f_s}\right)^2=1+\frac{C_1}{C_L+C_0} \qquad (18)$$

$$\frac{2\Delta f_s}{f_s}+\left(\frac{\Delta f_s}{f_s}\right)^2=\frac{C_1}{C_L+C_0} \qquad (19)$$

However, $$\frac{\Delta fs}{fs}<<1$$

since the incremental change in frequency $\Delta f_s$ is negligible compared to $f_s$, so that the equation can be simplified to the following form:

$$\frac{2\Delta f_s}{f_s}\approx\frac{C_1}{C_L+C_0} \qquad (20)$$

It follows, therefore, that the incremental change in the series resonance frequency is:

$$\frac{\Delta fs}{fs}\approx\frac{1}{2}\frac{C_1}{C_0+C_L} \qquad (21)$$

It is obvious from Equation 21 that the series resonance frequency of the entire circuit varies inversely with the load capacitance. As both $C_1$ and $C_0$ are fixed, once the particular physical dimensions of the crystal and the electrodes are established, the frequency deviation $\Delta fs/fs$ is determined by the value of the load capacitance.

A fixed value of load capacitance $C_L$ thus produces a fixed amount of frequency deviation $\Delta fs/fs$ at a desired reference temperature to establish a new reference series resonance frequency $fs_r$ for the entire circuit at some higher value of frequency. If the value of the load capacitance is varied about the fixed value of $C_L$, $\Delta fs/fs$ varies inversely with the load capacitance variations, and the reference series resonance frequency for the entire circuit is changed. For example, if the load capacitance $C_L$ increases from its reference value, the frequency deviation $\Delta fs/fs$ decreases, and the series resonance frequency correspondingly decreases from the reference value $fs_r'$. Similarly, if the load capacitance $C_L$ decreases from its reference value, the frequency deviation is increased, and the series resonance frequency of the entire circuit also increases. Thus, a mechanism is available for compensating any temperature induced frequency variations of the crystal by correspondingly varying the load capacitance with temperature to produce an equal and opposite effect on the resonance frequency, thereby cancelling out or minimizing the temperature induced frequency variations of the crystal.

Figure 2:
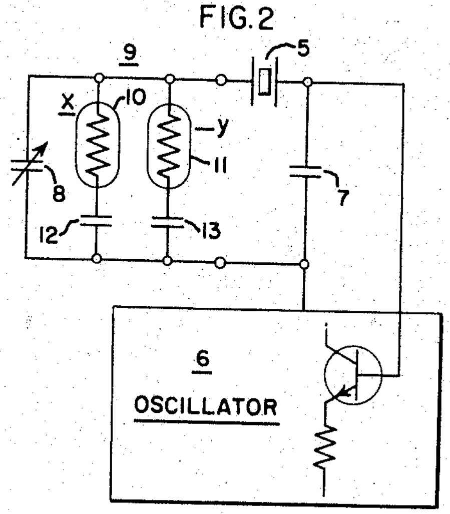
FIG. 2 is a schematic diagram of a temperature compensated piezoelectric crystal oscillator according to the instant invention.

FIG. 2 illustrates one embodiment of a network for achieving the temperature controlled compensating effect as part of a crystal controlled oscillator. A frequency determining crystal 5 is connected to an oscillator circuit shown generally in block diagram form at 6. The oscillator circuitry 6 may be any one of a number of well-known transistor or tube circuits for sustaining oscillations, with the frequency of these oscillations being controlled by the series resonance frequency of crystal 5 and its associated circuitry. A fixed trim capacitor 7 and a variable trim capacitor 8 are connected to crystal 5. Also connected to crystal 5 is a temperature compensating network 9 having two individual circuit branches X and Y which circuit branches are effective over selected portions of the temperature range to produce capacitance variations which compensate for and counteract the frequency variations of the piezoelectric crystal due to changing ambient temperature.

Circuit branches X and Y include temperature sensitive resistance elements 10 and 11 (i.e., thermistors) connected respectively in series with fixed capacitors 12 and 13. Thermistor elements 10 and 11 are so chosen that resistance variations with temperature are effective only over a desired portion of the temperature range.

Although the thermistor resistance continues to vary, as the temperatures change beyond the desired portion of the temperature range, the increase or decrease in resistance at the opposite ends of the temperature range are no longer effective to decrease or increase the capacity of the branch in any meaningful fashion.

The temperature coefficients of resistance of thermistors 10 and 11 are chosen to be either positive or negative depending on the slope of the crystal temperature-frequency characteristics over the particular portion of temperature range.

If the slope of the crystal temperature-frequency characteristic is positive, (i.e., the change in the series resonance frequency increases with temperature) the temperature coefficient of resistance of the thermistor is chosen to be negative. The resistance of the Thermistor then decreases with increase in temperature which, as will be described and analyzed in detail presently, increases the equivalent capacitance presented to the crystal 5. This increase in capacitance with temperature increases the load capacitance $C_L$, which in turn decreases the frequency deviation $\Delta fs/fs$, and reduces the series resonance frequency. Since the increase in temperature tends to produce an increase in the series resonance frequency of the crystal itself, the decrease in the series resonance frequency due to the change in the load capacity produced in the compensating network counteracts or minimizes the temperature effects, thereby maintaining the series resonance of the crystal substantially constant over the desired temperature range.

In the circuit of FIG. 2, the compensating network is of a relatively simple configuration. The network is designed to compensate only the upper and lower temperature range of a typical "AT" crystal which has the usual S shaped temperature-frequency characteristic of crystals of this cut. Branch circuit X has a negative temperature coefficient of resistance thermistor 10 which is designed to be operative at temperatures below $T_2$ ($T_2<T_0$), whereas branch Y has a negative temperature coefficient of resistance thermistor 11 operative above $T_3$ ($T_3>T_0$).

Thermistors are well-known temperature sensitive resistance elements which are characterized by the fact that their resistance varies as a function of temperature. The manner in which their resistance varies, i.e., whether the resistance increases or decreases with the temperature, may also be controlled in that thermistors having positive and negative coefficients of resistance with temperature are available. Thermistors are available which vary in resistance over a desired range of temperature from a very high value, resistances on the order of several hundred thousand to several million ohms, to a very low value on the order of several ohms.

Thermistors are available in a great variety of resistance values and temperature coefficients. These may be selected to suit the needs of the particular compensating network branch in terms of temperature and resistance value. As will be explained in detail later, it is also possible to use series and parallel combinations of thermistors and fixed resistors in order to achieve many different temperature-resistance characteristics.

The equivalent capacity and, therefore, the capacity seen by crystal 5 is a function of the resistance in circuit with capacitors 12 and 13. It can be shown that the magnitude of the capacitance of each branch is inversely proportional to the resistance in that branch. If the resistance increases, the capacitance decreases, whereas a decrease in the resistance increases the capacitance. This may be seen more easily on the basis of the following analysis. A series RC circuit can, of course, always be converted to its equivalent parallel form. The values of the equivalent parallel capacitances and resistances $C_p$ and $R_p$ can be calculated as follows from the standard equation for the admittance Y of the circuit:

$$Y=\frac{1}{Z}=\frac{1}{R+jX} \tag{22}$$

$$Y=\frac{1}{R+\frac{1}{jwC_{X,Y}}} \tag{23}$$

$$=\frac{1}{\frac{jwC_{X,Y}R}{jwC_{X,Y}}+\frac{1}{jwC_{X,Y}}} \tag{24}$$

$$=\frac{jwC_{X,Y}}{1+jwC_{X,Y}R} \tag{25}$$

$$=\frac{jwC_{X,Y}}{1+jwRC_{X,Y}}\cdot\frac{1-jwRC_{X,Y}}{1-jwRC_{X,Y}} \tag{26}$$

$$=\frac{jwC_{X,Y}-j^2w^2RC^2_{X,Y}}{1-(jwRC_{X,Y})^2} \tag{27}$$

$$=\frac{jwC_{X,Y}+R(wC_{X,Y})^2}{1+(wRC_{X,Y})^2} \tag{28}$$

$$=jw\frac{C_{X,Y}}{1+(wRC_{X,Y})^2}+\frac{R(wC_{X,Y})^2}{1+(wRC_{X,Y})^2} \tag{29}$$

$$Y=jwC_p+\frac{1}{R_p} \tag{30}$$

where $$C_p=\frac{C_{X,Y}}{1+(wRC_{X,Y})^2} \tag{31}$$

It can be seen from the Equations 29–31 that the imaginary or "j" term of the equation, and thus the capacitance $C_p$ of this network, is a function of R, with the capacitance varying inversely with R. Since R is a thermistor which varies as a function of temperature, the capacity presented by the circuit branches X and Y varies with temperature. Since the series frequency deviation $\Delta fs/fs$ of the entire circuit varies as a function of the capacity it can be seen that the series resonance frequency is controlled by means of the temperature-sensitive thermistor elements 10 and 11. It can be seen from equation 31 that as the thermistor resistance becomes very large, the value of the equivalent capacitance $C_p$ across the branch terminals becomes a very small fraction of the capacitance value of the capacitors 12 and 13, i.e., as the value of the term $(wC_{X,Y}R)^2$ becomes very large, $C_p$ approaches zero (0). Conversely, as the resistance of the thermistor becomes very small, the term $(wC_{X,Y}R)^2$ becomes very small, and the value of capacitance $C_p$ across the branch terminals approaches $C_{X,Y}$, $(C_p \rightarrow C_{X,Y})$. By properly selecting the temperature coefficient of the thermistor, and the value of resistance variations with temperature, the crystal series resonance frequency may be varied by an amount which is equal and opposite to the temperature-frequency characteristic of the crystal. By thus arranging so that the crystal frequency change with temperature produced by the compensating network has a slope which is opposite in sign and equal in magnitude to the intrinsic temperature-frequency characteristic of the crystal, the crystal may be suitably compensated over any desired temperature range.

Figure 3:
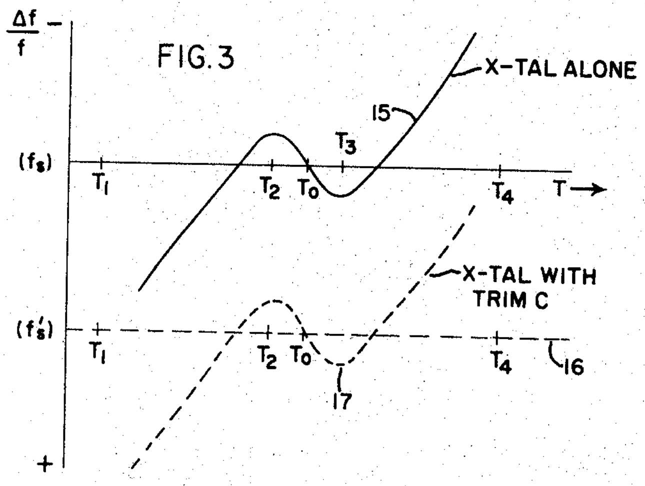
FIGS. 3–6 are a series of curves which show the temperature-frequency characteristics of the crystal, the effects of the compensating network, and the compensated crystal characteristics.

The manner in which compensating network 9, as a whole, and the circuit branches X and Y, individually, function to compensate the upper and lower portions of the temperature range may be most easily understood by reference to FIGS. 3–6 which are graphical representations of the temperature-frequency characteristics of the crystal, the compensating network, and the entire circuit arrangement. In FIG. 3, temperature "T" is plotted along the abscissa and frequency deviation $\Delta fs/fs$ along the ordinate. Curve 15 shows the typical S shaped temperature-frequency characteristic of an "AT" cut crystal without any load capacitance. Since trim capacitors 7 and 8, as well as portions of the capacitors 12 and 13, are connected to crystal 5 of FIG. 2, the series resonance frequency of the entire circuit varies about a new higher reference level $fs'$ represented by the dashed line 16. The temperature-frequency variations of the crystal and its associated circuitry are represented by the dotted S shaped curve 17. It will be noted that curve 17 has the same shape as curve 15, merely being displaced along the ordinate. Curve 17 represents the frequency-temperature variations of this entire network if thermistors 12 and 13 were not present in the circuit to vary the magnitude of the capacitances presented by circuit branches X and Y, i.e., as if the load capacitance seen by the crystal were fixed.

Thermistor 10 is, as pointed out in connection with the description of FIG. 2, a negative temperature coefficient thermistor, the effective resistance of which varies over temperatures below $T_2$ $(T_2 < T_0)$. Its effective operating range is between $T_2 - T_1$ although its resistance will still vary as the temperature falls below $T_1$. At $T_1$, however, the resistance of thermistor 10 is sufficiently high that further increases in resistance with further decreases in temperature have practically no effect on the capacitance. Thus, the effective range of the thermistor is limited to $T_2 - T_1$, since its control on the capacitance is also limited, and at $T_1$ the capacitance across the terminals of circuit branch X is effectively at a minimum as may be seen from the Equation 31. The total load capacitance $C_L$ at $T_1$ is also at a minimum having been reduced from its reference value at $T_0$ by an amount equal to the value of capacitor 12. Since the load capacitance has been reduced from its reference value at $T_0$ the frequency deviation increases as shown along the ordinate. As the temperature increases between $T_1$ and $T_2$, the resistance of thermistor 10 decreases due to its negative temperature coefficient of resistance, and the capacitance of branch X increases until, at $T_2$, the resistance of the thermistor is at a sufficiently low value so that the capacitance of branch X is essentially equal to the capacitance of capacitor 12. Thus, as more capacitance is added to the circuit between $T_1$ and $T_2$, the load capacitance $C_L$ increases from its value at $T_1$ thereby decreasing the amount of the frequency deviation produced until the frequency deviation due to branch X reaches a minimum value at $T_2$. At higher temperatures, above $T_2$, branch X is ineffective in producing further changes since the resistance of its thermistor 10 is sufficiently low so that a further increase of temperature produces no significant additional change in effect on the capacitance of the branch.

Branch Y, which includes thermistor 11, is, however, operative over the temperature range $T_3 - T_4$ to produce frequency deviation which decreases with increasing temperature and compensates the crystal temperature-frequency characteristic at the upper end of the temperature range. At temperature $T_3$ and below, the resistance of thermistor 11 is sufficiently high so that resistance variations have no substantial effect. The capacitance of branch Y and its contribution to the compensating network as a whole is, therefore, at a minimum; that is, if thermistor 11 has a high resistance value so that R is much larger than $$\frac{1}{wC_{X,Y}}$$

i.e., $$R \gg \frac{1}{wC_{X,Y}}$$

it can be seen that the term $$\frac{C_Y}{1+(wRC_Y)_2}$$

approaches zero, and the capacity of the branch is essentially at zero. As the temperature increases from $T_3$ to $T_4$, the resistance of thermistor 11 decreases until at $T_4$ it is sufficiently low so that the capacitance across the terminals of branch Y is essentially that of capacitor 13 and further temperature increases are ineffective to produce capacitance changes even though the resistance may still vary.

Over the temperature range $T_3$ to $T_4$ the load capacitance seen by crystal 5 is a function of trim capacitors 7 and 8, capacitance 12 and then varying capacitance across branch Y. In other words, the load capacitance $C_L$ increases over and above the value of the load capacitance at the reference temperature $T_0$. This increase in the load capacitance over the range $T_3 - T_4$ reduces the frequency deviation $\Delta fs/fs$ and tends to reduce or lower the series resonance frequency of the crystal and its associated load circuit. This variation is illustrated by curve Y in FIG. 5. Over the same temperature range, the normal temperature-frequency characteristic of the crystal 5 is such as to increase the series resonance frequency of the crystal. However, the effect of the branch Y opposes and counteracts the intrinsic temperature-frequency characteristics of the crystal so that substantial compensation is effected over the rang $T_3 - T_4$.

Figure 4:
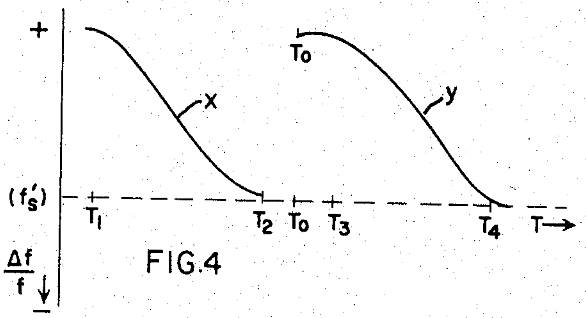
Figure 5:
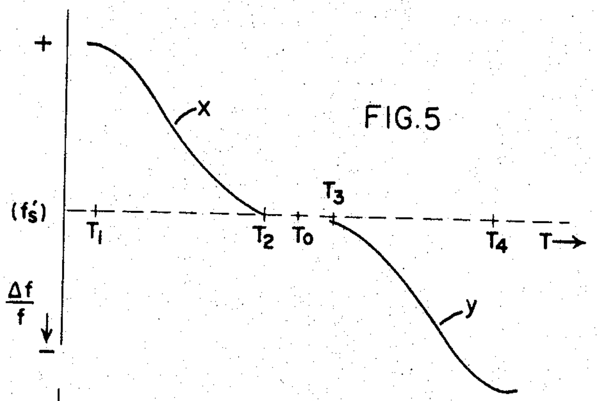
Figure 6:
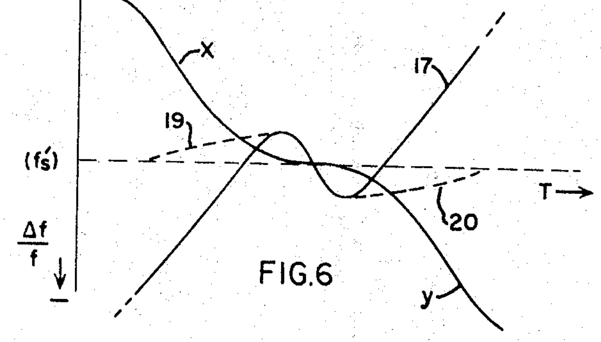

This may be seen most clearly in FIG. 6 where the various curves of FIGS. 3–5 are superimposed to illustrate their total relative effects and the resultant temperature-frequency characteristics of the crystal plus its compensating and load circuit. The temperature-frequency characteristic of the crystal, plus its trim capacitance, is shown by the solid curve 17 which is identical to the curve in FIG. 3. The frequency changes over $T_1 - T_2$, due to branch X, is illustrated by the curve labelled X, and, as may be seen by observation, these changes are equal and opposite to those due to the change in temperature. In other words, the slope of the crystal frequency variation with temperature produced by network X is opposite in sign to the slope of the intrinsic crystal temperature-frequency characteristic over the same temperatures.

Similarly, from $T_3$ to $T_4$ the frequency variations with temperature due to branch Y, as illustrated by the curve labelled Y, are substantially equal and opposite to the intrinsic temperature-frequency variations of the crystal over the same temperatures, i.e., the slopes of the two curves being of opposite signs. Dashed lines 19 and 20 show the compensated temperature-frequency characteristics of the crystal. It will be seen that the frequency variations of the crystal with temperature have been reduced and maintained within acceptable limits. This is particularly so as the temperature varies substantially from the reference temperature $T_0$ where the normal temperature-frequency characteristics of the uncompensated crystal produce substantial frequency variations with temperature.

It will be appreciated that the compensating network illustrated in FIG. 2 is a relatively simple and uncomplicated one and effects relatively limited compensation in that there are still some frequency variations with temperature. The instant invention is not limited by any means to a relatively simple compensating network of the type illustrated in FIG. 2. In fact, by utilizing a more complex network having additional branches or circuit components, it is possible to compensate over the entire temperature range and to compensate temperature-frequency characteristics other than the S shaped curve of an "AT" cut crystal. As shown in FIG. 6, the temperature compensating network of FIG. 2 does not compensate temperature frequency variations of the crystal in the temperature range $T_2$—$T_3$ which includes the reference temperature $T_0$, and particularly that part of the temperature range wherein the slope of the crystal temperature-frequency characteristic changes from a positive to a negative slope.

Figure 7:
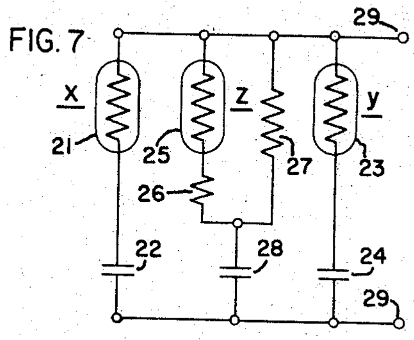
FIG. 7 is a schematic diagram of an alternative embodiment of a compensating network for a piezoelectric crystal.

FIG. 7 illustrates a somewhat more complex compensating network which is designed to compensate over the entire temperature range and to reduce the frequency excursion of the crystal and its associated network to a substantially greater extent than possible with the network of FIG. 2. The compensating network of FIG. 7 includes a circuit branch X designed to compensate for frequency variations in the temperature range below $T_2$, a circuit branch Y designed to produce temperature compensation over the temperature range above $T_3$, and circuit branch Z designed to compensate over the temperature range $T_2$—$T_3$. Branch X includes a negative temperature coefficient of resistance thermistor 21, having an operating range over temperatures below $T_2$, connected in series with a fixed capacitor 22. Branch Y also includes a negative temperature coefficient of resistance thermistor 23, having an operating range over temperatures above $T_3$, connected in series with fixed capacitor 24. Network Z includes a positive temperature coefficient of resistance thermistor 25 connected in series with a fixed resistance 26 and in parallel with a fixed resistor 27. The resistance network comprising resistors 25, 26, 27 is, in turn, connected in series with fixed capacitor 28.

Branches X and Y are the same as those illustrated and described in connection with FIG. 2 and function in the same manner. Branch Z of FIG. 7, however, includes a thermistor having a positive temperature coefficient of resistance, and its effect on series resonance frequency of the crystal is opposite to that of branches X and Y. The effect of network 2 on frequency is such that the slope of the frequency variations with temperature is positive in order to compensate for the temperature-frequency characteristic of the crystal which has a negative slope over this temperature range. In addition, network Z is arranged so that the resistance variations, and, hence, the capacitance and frequency variations, are much more limited than those of branches X and Y. Since thermistor 25 is connected in series with resistor 26 and in shunt with resistor 27 the total resistance variation of the branch, and hence the capacity variations across terminal 29 of branch Z, is limited by the relative values of resistors 26 and 27. Although the resistance of thermistor 25 may vary from zero ohms to several million ohms, depending on the thermistor, the equivalent resistance of the shunt network varies over a much narrower range. Resistor 26 is made quite small compared to resistor 27 and to the maximum resistance value of thermistor 25 but is large compared to the minimum resistance value of thermistor 25. The resistance of the shunt network thus varies between resistances of resistors 26 and 27 as limits.

This may be more easily seen by considering the following: At one end of the temperature scale, the resistance of thermistor 25 is several orders of magnitudes larger than that of resistors 26 and 27. The equivalent resistance $R_T$ of the shunt network is, of course, equal to their product divided by their sum;

$$R_T = \frac{R_{27}(R_{25}+R_{26})}{R_{25}+R_{26}+R_{27}}$$

With the resistance of thermistor 25 being very large compared to both resistors 26 and 27, it can be seen from the above equation that the divisor is essentially equal to the resistance of thermistor 25 and $R_T$ is then essentially the value of resistor 27. On the other hand, whenever the temperature is such that the resistance of thermistor 25 is at its low end, the resistance of the branch containing the thermistor is approximately equal to the resistance of resistor 26. Since the resistance of resistor 27 is substantially larger than that of resistance 26 the equivalent resistance is, therefore, equal to that of resistor 26. Thus, the resistance of this shunt branch varies effectively between $R_{25}$ and $R_{26}$. Similarly, the capacity appearing across the output terminal 29 and the frequency variations produced thereby over the desired temperature range varies over a much more limited range. This (as will be appreciated by recalling the shape and characteristics of the typical S shaped temperature frequency curve for an "AT" crystal) is necessary since the variations of frequency with temperature over the range $T_2$ to $T_3$ are much less than the temperature frequency variations below $T_2$ and above $T_3$.

Figure 8:
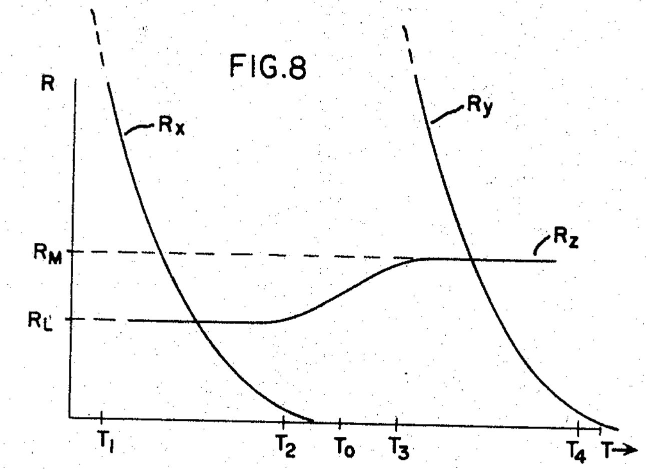
FIGS. 8–10 are curves indicating the variations of the resistance, capacitance, and frequency due to the network of FIG. 7.
Figure 9:
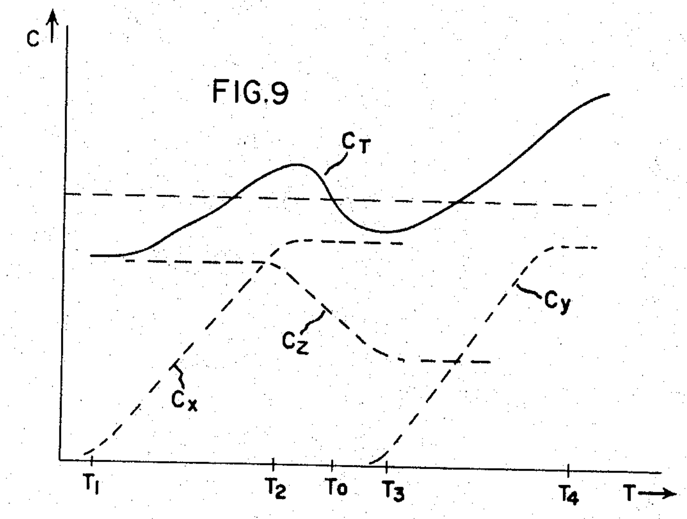
Figure 10:
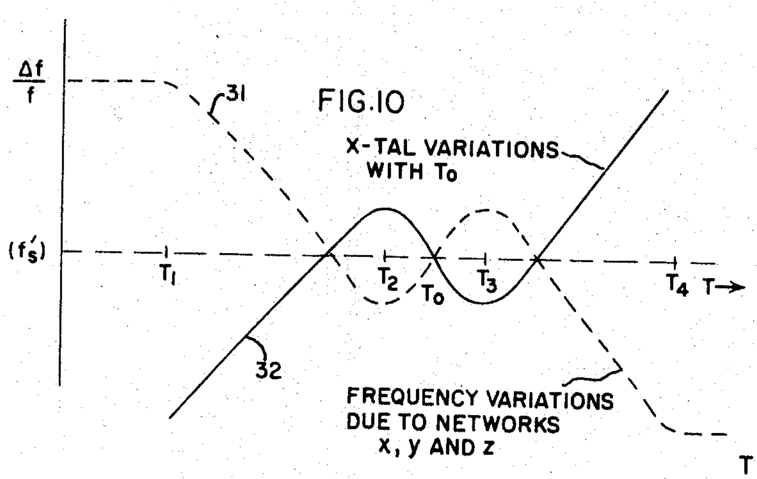

The manner in which the network of FIG. 7 operates to control and compensate the frequency of this "AT" cut crystal may again be best understood by referring to FIGS. 8–10 which illustrate graphically the variations of the resistance, capacitance, and frequency with temperature. FIG. 8 illustrates the resistance variations of the branches X, Y, and Z with temperature. Curve $R_X$ represents the resistance variations of thermistor 21 in branch X, $R_Y$, the resistance variations of branch Y and $R_Z$ of branch Z. As may be seen, the resistance variations $R_X$ are those of a thermistor with a negative temperature coefficient of resistance for it can be seen that the resistance of the branch increases as the temperature decreases. At $T_2$ and above the resistance is very low, i.e., $$R \ll \frac{1}{wC_X}$$

Below $T_2$ the resistance increases from this very low value until at $T_1$, and below, it has a very high value, i.e., $$R \gg \frac{1}{wC_X}$$

The resistance variations of branch Y and thermistor 23 are effectively limited to the upper temperature range $T_3$—$T_4$. The resistance of the branch thus decreases as the temperature increases from $T_3$—$T_4$. The resistance decreases from a very high value, i.e., $$R \gg \frac{1}{wC_Y}$$

to a very low value, i.e., $$R \ll \frac{1}{wC_Y}$$

Curve $R_z$ shows the resistance variations of branch Z and particularly of the shunt resistance network contained therein. It will be noted that at $T_2$ or below the resistance of the shunt network has a finite minimum value $R_L$ which is approximately equivalent to the resistance of resistor 26. This minimum resistance of branch Z is substantially higher than the minimum resistance of the other branches since the resistance of this branch never is as low as them inimum thermistor resistance because of the additional fixed resistors connected in circuit therewith. Over the temperature range $T_2$—$T_3$, the resistance of the branch increases with temperature since the thermistor 25 has a positive coefficient of temperature. However, the increase of resistance with temperature is limited, and the maximum value $R_M$ is also limited by the fixed resistors 26 and 27, and the maximum resistance $R_M$ at temperatures $T_3$ and above is limited by the value of resistance 27. That is, as pointed out previously, even though thermistor 25 may increase in resistance with temperature so that its resistance thermistor is very high, the equivalent resistance of the shunt network is controlled by the value of the parallel fixed resistance 27. In this manner, the resistance variations of the branch Z are controlled between two finite values $R_L$ and $R_M$. Obviously, by varying the absolute and relative magnitudes of resistors 26 and 27, the range of resistance values $R_L$ and $R_M$ between which the network varies may be suitably controlled.

FIG. 9 illustrates the corresponding capacitance variations due to the resistance variations in branches X, Y, and Z. As shown previously, the capacitance across the output terminals of the branches of the compensating network varies inversely with the resistance in each branch. In FIG. 9, the capacitance is plotted along the ordinate and the temperature along the abscissa. Thus, the dashed curves $C_X$, $C_Y$, $C_Z$ represent the capacitance variations of branches X, Y, Z respectively. The capacitance variations, it will be noted, have slopes which are opposite to the slope of the corresponding resistance variations. The maximum range of capacitance variations is, of course, limited by the magnitude of the fixed capacitors since the capacitance can only vary between zero and that value. In addition, hybrid thermistor resistance networks, such as the one shown in branch Z, may further limit the range of capacitance variations with temperature. In other words, the exact slope and range of the capacitance variations with temperature may be controlled both by controlling the resistance range of the thermistor, the resistance network of which the thermistor is a part, and by the magnitude and size of the fixed capacitance connected in circuit with the thermistors and resistors. The precise nature of the resistance and capacitance variations with temperature thus are a matter of the designer's choice and depends on the particular crystal utilized, its temperature variations over various ranges, and the various other design criteria for a particular circuit.

Curves $C_X$ and $C_Y$ illustrate the capacitance variations of branches X and Y over the temperature ranges $T_1$—$T_2$ and $T_3$—$T_4$. The general shape of the curve $C_X$ and $C_Y$ and the range of capacitance variations are substantially identical for both branches. However, as pointed out previously, this need not be so as the designed has the choice of varying both the shape and range of the capacitance variation over the desired temperature range to suit the particular needs of his circuit. Curve $C_Z$ shows the capacitance variation of network Z over the temperature range $T_2$—$T_3$. As will be noted, the range of capacity variations is much less than those of branches X and Y due to the effects of the hybrid resistance-thermistor network consisting of thermistor 25 and resistors 26 and 27. It will also be noted that the slope of curve $C_Z$ over its operative temperature range $T_2$—$T_3$ is opposite in sign to the slope of the capacitance variations of branches X and Y.

The resultant capacitance variations over the entire temperature range are shown by the solid curve $C_T$ which represent the sum of curves $C_X$, $C_Y$, and $C_Z$ over the entire range. Since the capacitors in the branches are in parallel the capacitances may be added directly so that the total capacitance $C_T$ of the network is equal to the sum of the capacitances. However, practice of the invention is not limited to compensating networks in which the capacitors are connected in parallel branches although these may be preferred for the sake of design simplicity and are preferred for simplicity of illustration. Curve $C_T$ has generally the same shape as the temperature-frequency characteristics of the crystal, i.e., the typical S shape of the "AT" cut crystal. The temperature-capacitance variations of the network not only have the same shape as the crystal temperature-frequency variations, but the sign of the slope of the two curves is the same over different portions of the temperature range. The reasons for this will be readily appreciated in connection with FIG. 10.

FIG. 10 illustrates graphically the temperature-frequency characteristic of the crystal without temperature compensation and also the temperature compensating effects due to the network consisting of branches X, Y, and Z. Curve 31 represents the variations in the series resonance frequency of the crystal due to the capacitance variations with temperature shown by cure $C_T$ in FIG 9. The frequency variations $\Delta fs/fs$ shown by curve 31 are determined by the capacitance variations as illustrated by the curve $C_T$ of FIG. 9, and the trim sensitivity of the crystal where trim sensitivity is expressed as the change of frequency per unit capacitance change. In other words, trim sensitivity is the change in frequency, in parts per million, per picofarad or microfarad, or whatever incremental capacitance unit is used. Hence, the frequency changes $\Delta fs/fs$ in parts per million at any temperature T is equal to the product of the capacitance variation of the network at the particular temperature and the trim sensitivity of the particular crystal.

Curve 31 has the same general shape as the crystal temperature-frequency characteristic shown by the solid line curve 32 (which is the well-known and recognizable S-shaped temperature-frequency variation of an "AT" cut crystal). Curve 31 is, however, inverted, and the sign of the slope of curve 31 over any portion of the temperature range is opposite to the sign of the slope of curve 32. Thus, as the temperature varies from the reference temperature $T_0$, the frequency deviation of the crystal with temperature is compensated by the frequency deviation introduced by the network since the latter produces an effect which is equal and opposite to the effect on the crystal due to temperature. Hence, for the more complex network illustrated in FIG. 7, the temperature-frequency variations of the crystal are effectively cancelled, and the crystal series resonance frequency $fs'$ is maintained over substantially the entire temperature range $T_1$—$T_4$.

In considering temperature variations of the branch circuit resistance, capacitance, and their compensating effect on the crystal temperature-frequency characteristics, it will be noted that the thermistors are so chosen that the resistance variations of each of the branches over the desired portion temperature range have a slope which is opposite in sign to the slope of the crystal temperature-frequency variations. The capacitance variations, on the other hand, have a slope which has the same sign as the temperature-frequency variations of the crystal. As the crystal resonance frequency varies inversely with the capacitance, the slope of the capacitance over the temperature range must have the same sign as the slope of the crystal temperature-frequency characteristics. Only in this manner is the frequency change due to the compensating network capacitance equal and opposite to the change of the crystal frequency with temperature. Furthermore, since the capacitance across the output terminals of the network branches varies inversely with the resistance in the branch, it is immediately apparent that the slope of the resistance of each branch in the network must be opposite in sign to the slope of the crystal temperature-frequency characteristics over that range. The slope of the resistance curve, its sign, and the particular operating temperature range is, of course, controlled by choosing the thermistors to have the proper resistance variations over the desired temperature range and by selecting the temperature coefficient of the thermistor to have the proper sign.

The compensating network illustrated in FIGS. 2 and 7 consisted of a plurality of parallel branches. Such an arrangement is often preferred from the standpoint of simplicity of design and operation. However, as pointed out previously, the instant invention is by no means limited to a network in which the various circuit branches are connected in parallel. The network may be constructed of branches having temperature-sensitive resistance components which are connected in series with each other and with the capacitor, or, alternatively, a network which is a hybrid of shunt and series connected branches.

Figure 11:
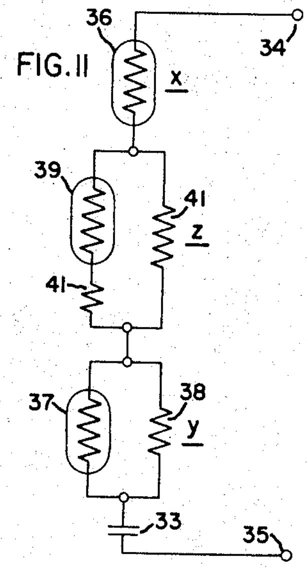
FIGS. 11 and 12 are further alternative embodiments of temperature compensating networks for a piezoelectric device.

FIG. 11 illustrates an alternative embodiment in which the circuit branches, and particularly the temperature responsive elements thereof, are connected in series with each other and with a fixed capacitor. Thus, circuit branch X is connected in series with branches Y and Z and with the fixed capacitor 33; the whole compensating network including a plurality of series connected branches having output terminals 34 and 35 for connection to the crystal. Branch X consists simply of a negative temperature coefficient of resistance thermistor 36 operative below $T_2$ to compensate the crystal over the lower end of the temperature range.

Branch Y, which compensates the crystal for temperatures above $T_3$, consists of a negative temperature coefficient of resistance thermistor 37 connected in parallel with a fixed resistor 38. Resistor 38, in the manner explained in connection with FIG. 7, limits the resistance variation of branch Y at the lower temperature $T_3$ and, hence, its effect on the capacitance variations. That is, when the resistance of thermistor 37 is very high, at or below $T_3$, the resistance of the shunt network is limited by the value of the fixed resistor 38. When thermistor 37 is at its minimum resistance value, the resistance of the shunt network is equal to the resistance of the thermistor. In this manner, the resistance variations of this branch are limited at one end of the temperature range $T_3—T_4$.

Network branch Z is identical in configuration to the network Z illustrated in FIG. 7 and is again intended to effect compensation of the crystal over the temperature range $T_2—T_3$. Branch Z includes a positive temperature coefficient of resistance thermistor 39 connected in series with a fixed resistor 40 and in parallel with a fixed resistor 41. As was previously explained, this limits the resistance variations of the Z branch at both ends of the temperature range $T_2—T_3$ between the resistance values of resistor 40 and resistor 41. Thus, if thermistor 39 is at its maximum value, the resistance of branch Z is effectively equal to the resistance of shunt resistor 41, whereas if thermistor 39 is at its minimum, the resistance of branch Z is effectively equal to the resistance of resistor 40 which has a value which is substantially less than the value of resistor 41. In this way, the resistance variations of network Z may be even more circumscribed and limited than the resistance variation of the parallel network Y. It will be appreciated that over the entire temperature range $T_1—T_4$, the resistance in series with fixed capacitor 33 is the sum of the resistance values of each of the branches X, Y, and Z; and, hence, the capacitance appearing across the output terminals 32 and 33 of the network is once more a function of the resistance variations of network branches X, Y, and Z.

Figure 12:
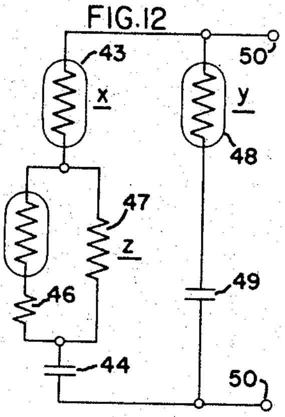

FIG. 12 is another embodiment of the invention which is a hybrid of the networks illustrated in FIGS. 7 and 11 in that the compensating network includes both parallel and series connected branches. Thus, the network branches X and Y intended to compensate at the lower and upper ends of the temperature range are connected into separate shunt branches. Branch X, however, is also connected in series with the branch Z which compensates the middle temperature range. Compensating circuit branch X again consists of a negative temperature coefficient of resistance thermistor 43 operative below $T_2$. Branch X is connected in series with branch Z and with a fixed capacitor 44. Branch Z contains a positive temperature coefficient of resistance thermistor 45 connected in series with a fixed resistor 46 and in parallel with resistor 47. Branches X and Z are connected in parallel with branch Y which inculdes a negative temperature coefficient thermistor 48 operative above $T_3$. Thermistor 48 is connected in series with a fixed capacitor 49 and across a pair of output terminals 50.

The manner in which each of these compensating circuit branches X, Y, and Z functions to produce capacitance variations across output temrinals 50 to compensate a piezoelectric crystal is the same as explained in connection with FIGS. 2, 7, and 11. It should be understood that the invention is not limited to the particular configuration shown here since many more combinations of branches may be utilized to provide the desired combination. That is, many more branches may be utilized to compensate temperature-frequency crystal characteristics other than the S shaped characteristic for an "AT" cut crystal. By means of this invention, frequency-temperature characteristics of almost any degree of complexity may be compensated by designing a series of simple, compensating circuit branches, each of which is operative over a single portion of the desired temperature range and which do not interact with the remaining branch circuits. All that need be done is to design each branch to be effective over the single desired portion of the temperature range and to produce a frequency compensatoin effect with temperature which has a slope which is opposite in sign to the temperature-frequency characteristic of the crystal over the same portion of the temperature range. By varying the branch resistance suitably by means of a thermistor having a suitable temperature coefficient of resistance, the slopes of the resistance, capacitance and, hence, the compensating frequency variations may be suitably adjusted to provide almost complete compensation of the crystal over the desired temperature range.

Nor is the instant invention limited to a compensating network in which the temperature-sensitive resistor, which controls the magnitude of the capacitance appearing across the output termnials of the branches and of the network, must always be connected in series with a fixed capacitance. It will be obvious to and understood by those skilled in the art that the temperature-sensitive resistors and sensitive networks may also be connected in shunt with the fixed capacitors. The effect of the resistance variations on the capacitance across the output terminals with the resistance in shunt with the capacitor will, of course, be opposite to that produced with the resistors in series with the capacitors. That is, as pointed out previously, with the temperature-sensitive resistances and resistive networks in series with the capacitor, the capacitance appearing across the output terminals was at a maximum whenever the resistance was at a minimum and at a minimum whenever the resistance was at a maximum. With the temperature-sensitive resistors and resistive networks in shunt with the capacitors, the effect is just the reverse. The capacitance appearing across the output terminals of the compensating branch or network is at a maximum when the resistance is at a maximum and is at a minimum when the resistance of the thermistor and the associated resistance network is at a minimum. However, the principle of the invention in so arranging the capacitance and resistance variations that the frequency changes produced thereby always has a slope with a sign opposite to that of the crystal frequency-temperature variations over the desired temperature range and of connecting a plurality of such branches and networks in tandem so that they each operate over separate portions of the temperature range remains fundamentally and essentially the same.

While a particular embodiment of this invention has been shown, it will, of course, be understood that it is not limited thereto since many modifications in the circuit employed may be made. It is contemplated by the appended claims to cover any such modification as may fall within the true spirit and scope of the invention.

What is claimed as new and desired to be secured by Letters Patent is:

1. In a temperature-compensated crystal oscillator, the combination including a frequency-determining crystal, the resonance frequency of which varies as a function of temperature:

(a) a network in circuit with said crystal for varying the load capacitance in circuit with said crystal as a function of temperature over a desired temperature range to produce crystal resonance frequency variations with temperature which counteract the effects of temperature on the crystal, including (b) a fixed, linear capacitance means, (c) first and second branches, each including temperature-sensitive resistance beams effective respectively over first and second portions of an operative temperature range to vary the capacitance across the output of the network as a function of temperature, the temperature coefficients of said resistance means being so chosen as to provide capacitance-temperature characteristics with slopes of predetermined sines and magnitudes over said first and second portions.

2. In a temperature compensated oscillator the combination including, (a) a frequency determining "AT" cut crystal having an S-shaped frequency-temperature characteristic with a positive slope in a first portion of the operational temperature range, a negative slope in a second, higher portion of the temperature and a positive slope in a third, yet higher, portion of the temperature range, (b) a network having first, second and third branches in circuit with said crystal, each of said branches being effective over one of said first, second and third portions for producing crystal load capacitance variations with temperature which counteract the temperature caused variations in the crystal resonance frequency, including (c) fixed capacitance means, (d) said first, second, and third branches including, respectively, resistance means incorporating a temperature-sensitive resistor to vary the resistance in circuit with the fixed capacitance means to vary the load capacitance for said crystal, the temperature coefficients of resistance of said first and third branches being of the same polarity and of opposite polarity to that of the one in said second branch, the polarities of the coefficients being so chosen that the resistance variations and the corresponding capacitance variations over the portion of the temperature range produce a change in the crystal resonance frequency which counteracts the effects on the crytsal due to temperature.

3. The crystal oscillator, according to claim 2, wherein the temperature-sensitive resistors in the first and third branches have negative temperature coefficients of resistance, and the temperature-sensitive resistor of the second branch has a positive temperature coefficient of resistance.

4. In a temperature compensated oscillator the combination including, (a) a frequency determining "AT" cut crystal having an S-shaped frequency-temperature characteristic with a positive slope in a first portion of the operational temperature range, a negative slope in a second, higher portion of the temperature, and a positive slope in a third, yet higher, portion of the temperature range, (b) a network having first, second, and third parallel branches in circuit with said crystal, each of said branches being effective over one of said first, second and third portions of the operative temperature range for producing load capacitance variations with temperature which counteract the temperature caused variations in the crystal resonance frequency, each of said branches including, (1) a fixed capacitor, and (2) said first and third branches including resistance means in series with the fixed capacitor, said resistance means incorporating temperature-sensitive resistors having negative temperature coefficients of resistance effective to vary the capacitance over said first and third portions of the temperature range, and said second branch including resistance means having a temperature-sensitive resistor with a positive temperature coefficient of resistance effective over said second portion of the temperature range.

5. The temperature compensated crystal oscillator, according to claim 4, wherein the resistance means in said second branch includes a shunt network including a fixed resistor in one arm of said shunt network and at least said temperature-sensitive resistor in the other to limit the range of resistance variations with temperature.

6. The temperature compensated crystal oscillator, according to claim 5, wherein the arm containing said temperature-sensitive resistor has a fixed resistor connected in series with said temperature-sensitive resistor.

7. In a temperature compensated oscillator the combination including, (a) a frequency determining "AT" cut crystal having an S-shaped frequency-temperature characteristic with a positive slope in a first portion of the operation temperature range, a negative slope in a second, higher, portion of the temperature, and a positive slope in a third, yet higher, portion of the temperature range, (b) a network having a fixed capacitor and first, second and third resistive branches connected in series with said fixed capacitor, said first, second, and third branches, each including a temperature-sensitive resistor effective respectively over first, second, and third portions of the temperature range, the resistors in said first and third branches having negative temperature coefficients of resistance so that the capacitance variations produced thereby are such that the resulting crystal frequency variations have a slope of opposite sign as a crystal frequency-temperature variations over these portions, the resistor in said second branch having a negative temperature coefficient so that the resulting crystal frequency variations have a slope opposite in sign to the crystal frequency-temperature variations over the second portion of the temperature range.

8. A network for producing a capacitance across its output terminals which varies with temperature in accordance with a predetermined complex pattern comprising, (a) a fixed linear capacitance means, (b) first and second branches, each including a temperature-sensitive resistance means effective respectively over first and second portions of an operative temperature range to vary the capacitance across the output terminals of the network as a function of temperature, the temperature coefficients of said resistance means being so chosen as to provide capacitance-temperature characteristics with slopes of predetermined signs and magnitudes over said first and second portions.

9. A network for producing a capacitance across its output terminals which varies as a function of temperature in accordance with a predetermined complex pattern, comprising (a) first, second, and third parallel branches effective over first, second, and third portions of an operative temperature range, (b) a fixed linear capacitor in each of said branches, (c) negative temperature coefficient of resistance resistors in said first and third branches to vary the effective capacitance of said branches over said first and third portions of the temperature and to produce capacitance-temperature characteristics with positive slopes over the first and third portions, (d) a positive temperature coefficient of resistance resistor in said second branch to vary the capacitance over the second portion of the temperature range and to produce a capacitance-temperature characteristic with a negative slope.

10. The network, according to claim 9, wherein said second branch includes a shunt network including a fixed resistor in one arm and at least said positive coefficient resistor in the other arm to limit the range of resistance variation with temperature.

References Cited

UNITED STATES PATENTS

| | | | |
|---|---|---|---|
| 2,881,315 | 4/1959 | Maciszewski | 331—176 |
| 2,959,743 | 11/1960 | WenYuan Pan | 331—176 |
| 3,054,966 | 9/1962 | Etherington | 331—116 |
| 3,176,244 | 3/1965 | Newell | 331—116 |
| 3,200,349 | 8/1965 | Bangert | 331—116 |
| 3,260,960 | 7/1966 | Bangert | 331—116 |

FOREIGN PATENTS

| | | |
|---|---|---|
| 811,095 | 4/1959 | Great Britain. |

MILTON O. HIRSHFIELD, *Primary Examiner.*

J. D. MILLER, *Assistant Examiner.*